United States Patent
Chen et al.

(10) Patent No.: US 11,877,456 B2
(45) Date of Patent: Jan. 16, 2024

(54) MEMORY CELL OF NON-VOLATILE MEMORY

(71) Applicant: eMemory Technology Inc., Hsin-Chu (TW)

(72) Inventors: Ying-Je Chen, Hsinchu County (TW); Wein-Town Sun, Hsinchu County (TW); Chun-Hsiao Li, Hsinchu County (TW); Hsueh-Wei Chen, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 244 days.

(21) Appl. No.: 17/381,468

(22) Filed: Jul. 21, 2021

(65) Prior Publication Data

US 2022/0085038 A1 Mar. 17, 2022

Related U.S. Application Data

(60) Provisional application No. 63/078,343, filed on Sep. 15, 2020.

(51) Int. Cl.
| | |
|---|---|
| H01L 21/28 | (2006.01) |
| H10B 43/35 | (2023.01) |
| G11C 16/04 | (2006.01) |
| H01L 29/423 | (2006.01) |
| H01L 29/792 | (2006.01) |
| H01L 29/66 | (2006.01) |
| H01L 29/788 | (2006.01) |
| H10B 41/10 | (2023.01) |

(Continued)

(52) U.S. Cl.
CPC ......... *H10B 43/35* (2023.02); *G11C 16/0466* (2013.01); *H01L 29/40117* (2019.08); *H01L 29/4234* (2013.01); *H01L 29/6656* (2013.01); *H01L 29/7881* (2013.01); *H01L 29/7923* (2013.01); *H10B 41/10* (2023.02); *H10B 41/35* (2023.02); *H10B 43/10* (2023.02)

(58) Field of Classification Search
CPC ........... H01L 29/40117; H01L 29/4234; H01L 29/6656; H01L 29/7881; H01L 29/7923; H10B 41/35; G11C 16/0466
See application file for complete search history.

(56) References Cited

U.S. PATENT DOCUMENTS

| | | |
|---|---|---|
| 7,551,494 B2 | 6/2009 | Lin et al. |
| 9,893,208 B2 | 2/2018 | Horiuchi |
| 9,966,141 B2 | 5/2018 | Horiuchi |

(Continued)

FOREIGN PATENT DOCUMENTS

| | | | |
|---|---|---|---|
| CN | 1855434 A | * | 11/2006 |
| TW | I406397 B | | 8/2013 |

*Primary Examiner* — Mohammad M Choudhry
(74) *Attorney, Agent, or Firm* — WPAT, P.C

(57) ABSTRACT

A memory cell of a non-volatile memory includes a memory element. The memory element is a transistor. The memory element includes an asymmetric spacer. In the memory element, a channel under the wider part of the spacer is longer. When the program operation of the memory element is performed, more carriers are injected into a charge-trapping layer of the spacer through the longer channel. Consequently, the program operation of the memory element is performed more efficiently, and the time period of performing the program operation is reduced.

16 Claims, 8 Drawing Sheets

(51) Int. Cl.
*H10B 41/35* (2023.01)
*H10B 43/10* (2023.01)

(56) References Cited

U.S. PATENT DOCUMENTS

| | | | |
|---|---|---|---|
| 2007/0109861 A1* | 5/2007 | Wang | H01L 29/7923 257/E21.21 |
| 2007/0272974 A1 | 11/2007 | King et al. | |
| 2015/0287732 A1* | 10/2015 | Tsao | H10B 41/40 257/319 |
| 2021/0183998 A1 | 6/2021 | Chen et al. | |

* cited by examiner

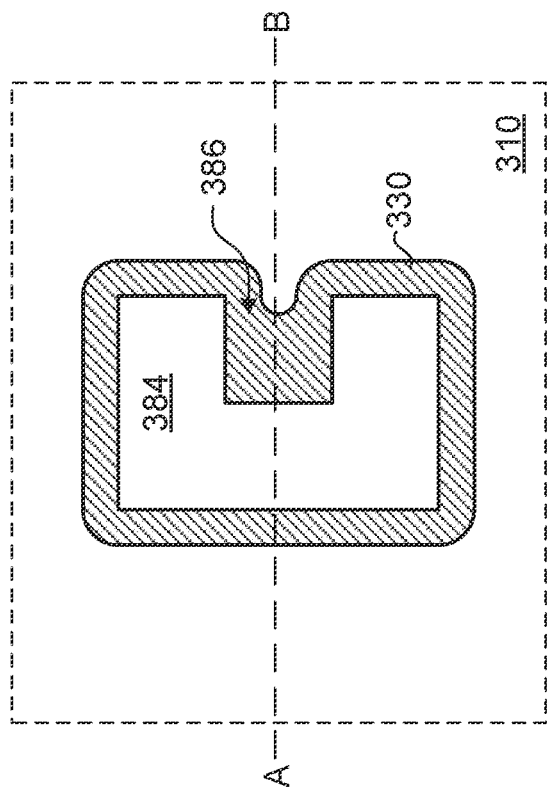
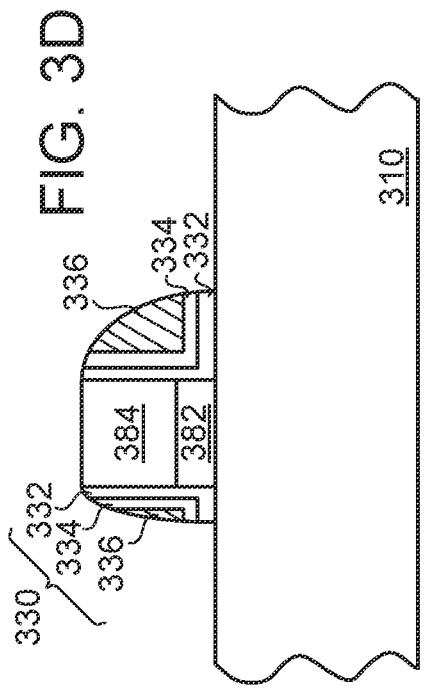
FIG. 3C
FIG. 3D
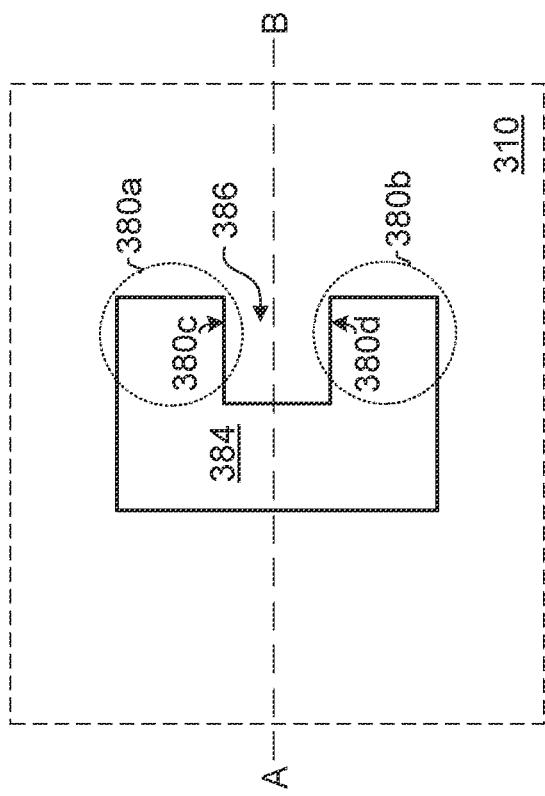
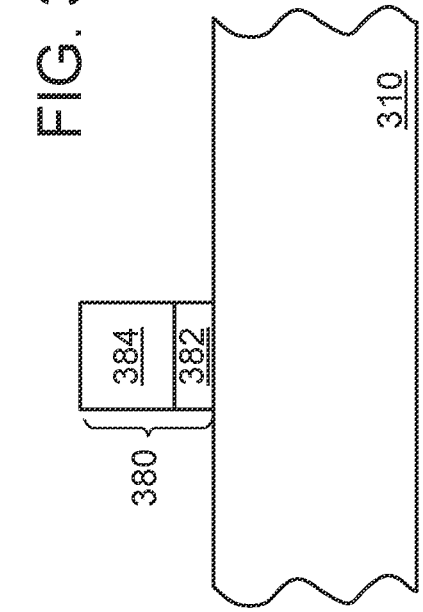
FIG. 3A
FIG. 3B

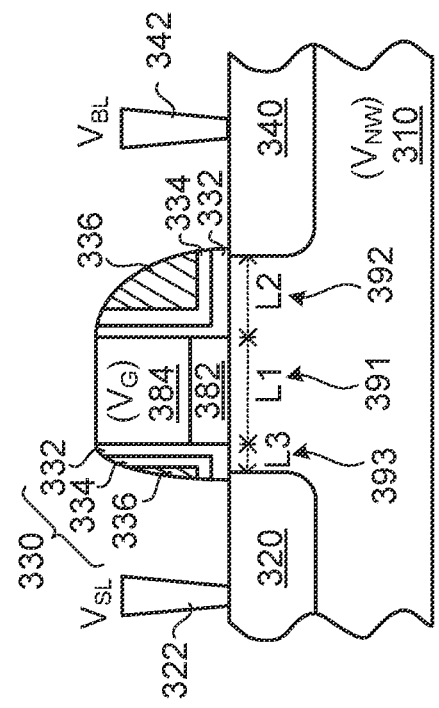
FIG. 3G
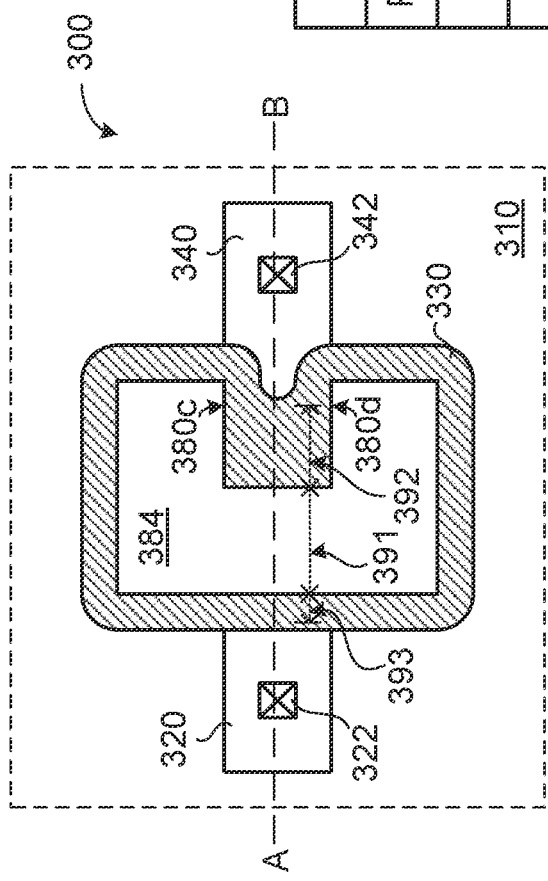
FIG. 3E
FIG. 3F

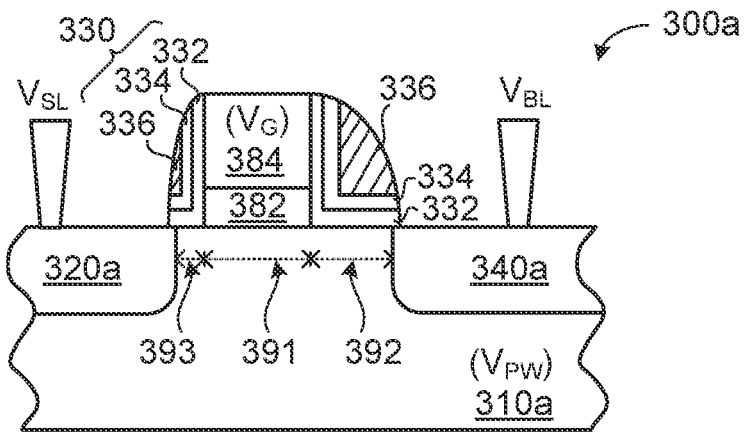
FIG. 4A
| N-channel transistor | $V_{SL}$ | $V_G$ | $V_{BL}$ | $V_{PW}$ |
|---|---|---|---|---|
| PGM (BBHH) | Floating | <=0V | +6V | 0V |
| ERS (CHE) | 0V | +6V | +6V | 0V |
| READ | +1V | +1V | 0V | 0V |
FIG. 4B
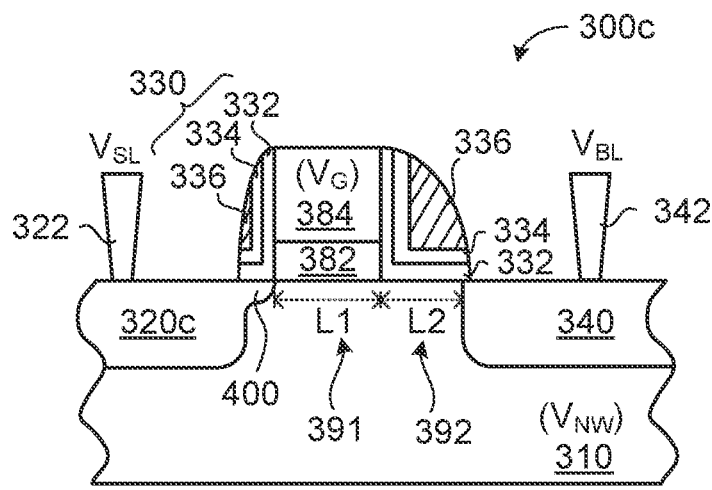
FIG. 4C

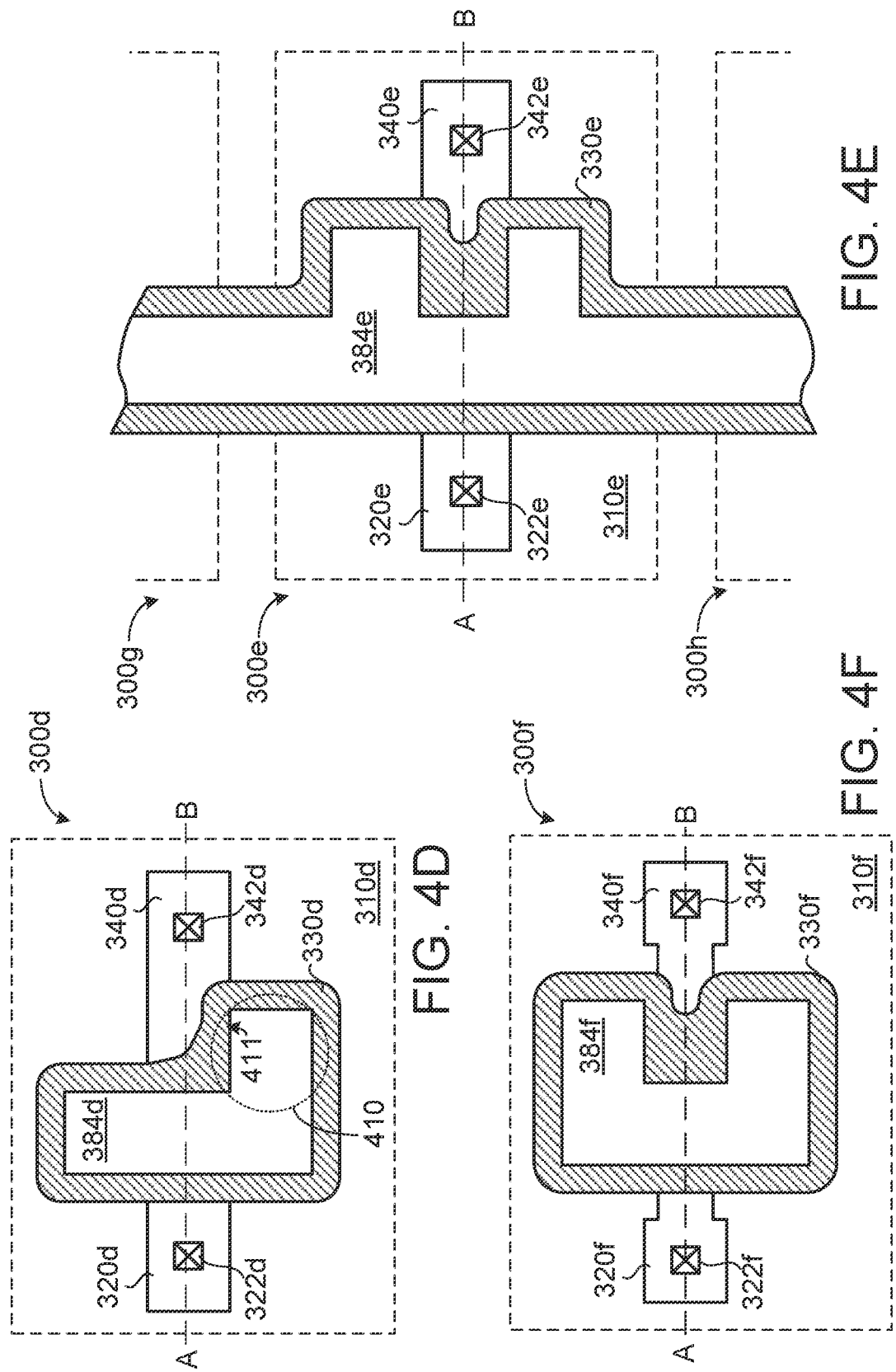

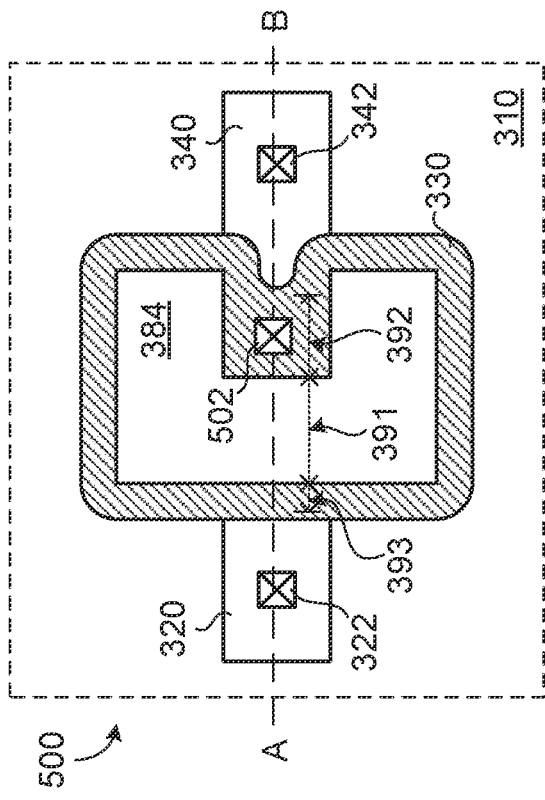
FIG. 5A
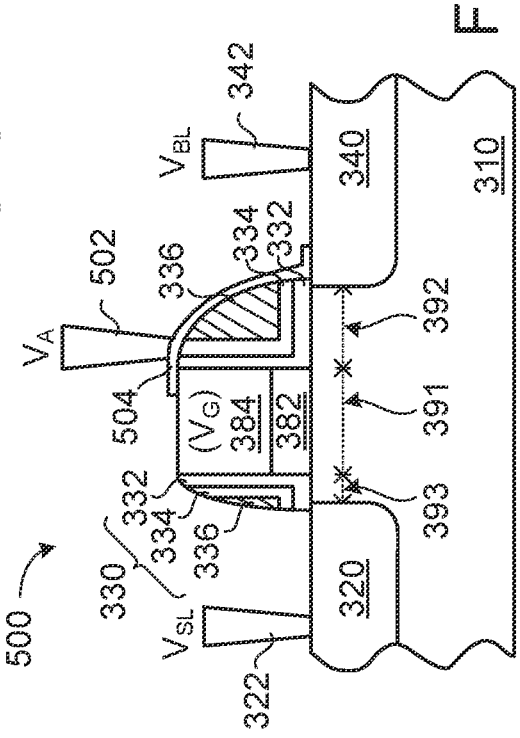
FIG. 5B
| P-channel transistor | $V_{SL}$ | $V_G$ | $V_{BL}$ | $V_{NW}$ | $V_A$ |
|---|---|---|---|---|---|
| PGM (BBHE) | Floating | >=0V | -6V | 0V | +3V |
| PGM (CHE) | 0V | -1V | -6V | 0V | -3V |
| ERS (CHH) | 0V | -6V | -6V | 0V | -3V |
| ERS (FN) | +6V | -6V | +6V | +6V | -6V |
| ERS (BBHH) | Floating | -6V | -6V | 0V | -3V |
| READ | -1V | -1V | 0V | 0V | -1V |
FIG. 5C
| N-channel transistor | $V_{SL}$ | $V_G$ | $V_{BL}$ | $V_{PW}$ | $V_A$ |
|---|---|---|---|---|---|
| PGM (BBHH) | Floating | <=0V | +6V | 0V | <=0V |
| ERS (CHE) | 0V | +6V | +6V | 0V | +6V |
| READ | +1V | +1V | 0V | 0V | +1V |
FIG. 5D

MEMORY CELL OF NON-VOLATILE MEMORY

This application claims the benefit of U.S. provisional application Ser. No. 63/078,343, filed Sep. 15, 2020, the subject matter of which is incorporated herein by reference.

FIELD OF THE INVENTION

The present invention relates to a memory cell of a non-volatile memory, and more particularly to a memory cell of a non-volatile memory comprising a memory element having an asymmetric spacer.

BACKGROUND OF THE INVENTION

FIG. 1 is a schematic cross-sectional view illustrating a memory element of a conventional non-volatile memory. The memory element is disclosed in U.S. Pat. No. 7,551,494. The memory element 10 is a P-channel transistor.

As shown in FIG. 1, the memory element 10 is isolated by an isolation structure 15. The isolation structure 15 is a shallow trench isolation structure (STI). The memory element 10 comprises an N well region 11, a control gate layer 18, a gate dielectric layer 16, an oxide-nitride-oxide (ONO) spacer 20, a P+ source doping region 12 and a P+ drain doping region 14.

The gate dielectric layer 16 and the control gate layer 18 are stacked over the surface of the N well region 11. Moreover, the ONO spacer 20 is arranged around a sidewall of the gate dielectric layer 16 and the control gate layer 18. The P+ source doping region 12 is located under the surface of the N well region 11 and beside a first side of the ONO spacer 20. The P+ drain doping region 14 is located under the surface of the N well region 11 and beside a second side of the ONO spacer 20. The gate dielectric layer 16, the control gate layer 18 and the ONO spacer 20 are located over the surface of the N well region 11 between the P+ source doping region 12 and the P+ drain doping region 14.

Moreover, a channel region is located under the N well region 11 between the P+ source doping region 12 and the P+ drain doping region 14. The channel region comprises a first channel 19, a second channel 29 and a third channel 39. The first channel 19, the second channel 29 and the third channel 39 have channel lengths L1, L2 and L3, respectively. The first channel 19 is located under the control gate layer 18. The second channel 29 is arranged between the P+ drain doping region 14 and the first channel 19. The third channel 39 is arranged between the first channel 19 and the P+ source doping region 12.

The ONO spacer 20 comprises a silicon oxide layer 22, a silicon nitride layer 24 and a silicon oxide layer 26. The silicon oxide layer 22 is contacted with the sidewall of the gate dielectric layer 16 and the control gate layer 18. Moreover, the silicon oxide layer 22 is contacted with the surface of the N well region 11 and extended to the P+ source doping region 12 and the P+ drain doping region 14. The silicon nitride layer 24 covers the silicon oxide layer 22. The silicon oxide layer 26 covers the silicon nitride layer 24. The silicon nitride layer 24 is used as a charge-trapping layer.

FIG. 2 schematically illustrates associated bias voltages for performing a program operation on the conventional memory element. When a program operation of the memory element 10 is performed, the P+ drain doping region 14 receives a drain voltage $V_D$, the P+ source doping region 12 is in a floating state, the N well region 11 receives a ground voltage (i.e., $V_{NW}=0V$), and the control gate layer 18 receives a gate voltage $V_G$. For example, the drain voltage $V_D=-3V\sim-5V$, and the gate voltage $V_G=0V\sim2V$. Under the above bias voltage conditions, the first channel 19 underlying the control gate layer 18 is turned off. Moreover, electron-hole pairs are generated at the junction between the N well region 11 and the P+ drain doping region 14 and a so-called band-to-band hot electron injection (BBHE) effect occurs. Consequently, electrons are injected into the silicon nitride layer 24 near the drain side through the second channel 29.

In addition to the BBHE effect, the program operation of the memory element 10 can be performed according to other bias voltages. For example, when the program operation of the memory element 10 is performed, a gate voltage $V_G$ is provided to turn on the first channel 19. Consequently, a channel hot hole induced hot electron injection (CHHIHE) effect occurs. Consequently, electrons are injected into the silicon nitride layer 24 near the drain side through the second channel 29. Since the electrons are injected into the silicon nitride layer 24 through the second channel 29, the ratio of the injection channel length to the total channel length may be expressed as $$\frac{L2}{(L1+L2+L3)}.$$

In other words, when the program operation is performed, electrons can be controlled to be selectively injected into the silicon nitride layer 24 overlying the second channel 29. Consequently, the memory element 10 is selectively in one of two storage states. Moreover, by providing other bias voltages to the memory element 10, an erase operation or a read operation can be performed. The operating principles of the erase operation and the read operation are not redundantly described herein.

In the memory element 10 fabricated by the current semiconductor manufacturing process, the sidewall of the control gate layer 18 in contact with the ONO spacer 20 has a symmetrical profile. In other words, the lengths of the second channel 29 and the third channel 39 in the memory element 10 are almost identical.

SUMMARY OF THE INVENTION

The present invention provides a memory cell of a non-volatile memory. The memory element of the memory cell has an asymmetric spacer. When a program operation is performed, more carriers are injected into the charge-trapping layer in the wider part of the spacer. The structure of the memory cell is specially designed. For example, a second channel of the memory cell is longer, and the ratio of the injection channel length to the total channel length is increased. Consequently, the program operation is performed more efficiently.

An embodiment of the present invention provides a memory cell of a non-volatile memory. The memory cell includes a memory element. The memory element includes a well region, a gate structure, a spacer, a first doped region and a second doped region. The gate structure is formed on a surface of the well region. The gate structure comprises at least one protrusion part. The spacer is arranged around a sidewall of the gate structure and contacted with the surface of the well region. The spacer includes a first part and a second part. The first doped region and the second doped region are formed under the surface of the well region. A region between the first doped region and the second doped region is a channel region. The channel region includes a first channel and a second channel. The sidewall of the gate structure comprises plural surfaces, and a first surface of the at least one protrusion part is in parallel with a length direction of the channel region. The first channel is located under the gate structure. The second channel is arranged between the first channel and the second doped region. The first part of the spacer is located over the second channel. When a program operation is performed, plural carriers are injected into a charge-trapping layer in the first part of the spacer through the second channel.

Another embodiment of the present invention provides a memory cell of a non-volatile memory. The memory cell includes a memory element and a select transistor. The memory element includes a well region, a first gate structure, a first spacer, a first doped region and a second doped region. The first gate structure is formed on a surface of the well region and the gate structure comprises at least one protrusion part. The first spacer is arranged around a sidewall of the first gate structure and contacted with the surface of the well region. The first spacer includes a first part and a second part. The first doped region and the second doped region are formed under the surface of the well region. A region between the first doped region and the second doped region is a channel region. The channel region includes a first channel and a second channel. The sidewall of the gate structure comprises plural surfaces, and a first surface of the at least one protrusion part is in parallel with a length direction of the channel region. The first channel is located under the first gate structure. The second channel is arranged between the first channel and the second doped region. The first part of the first spacer is located over the second channel. The select transistor includes the well region, a second gate structure, a second spacer and a third doped region. The second gate structure is formed on the surface of the well region. The second spacer is arranged around a sidewall of the second gate structure and contacted with the surface of the well region. The third doped region is formed under the surface of the well region. A region between the first doped region and third doped region is a fourth channel. The fourth channel is located under the second gate structure. When program operation is performed, plural carriers are injected into a charge-trapping layer in the first part of the first spacer through the second channel of the memory element.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 3A to 3F are schematic views illustrating a manufacturing process of a memory cell of a non-volatile memory according to a first embodiment of the present invention;

FIG. 3G schematically illustrates bias voltages for performing associated operations on the memory element of the memory cell according to the first embodiment of the present invention;

FIG. 4A is a schematic cross-sectional view illustrating a first variant example of the memory element of the memory cell according to the first embodiment of the present invention;

FIG. 4B schematically illustrates bias voltages for performing associated operations on the memory element as shown in FIG. 4A;

FIG. 4C is a schematic cross-sectional view illustrating a second variant example of the memory element of the memory cell according to the first embodiment of the present invention;

FIG. 4D is a schematic top view illustrating a third variant example of the memory element of the memory cell according to the first embodiment of the present invention;

FIG. 4E is a schematic top view illustrating a fourth variant example of the memory element of the memory cell according to the first embodiment of the present invention;

FIG. 4F is a schematic top view illustrating a fifth variant example of the memory element of the memory cell according to the first embodiment of the present invention;

FIG. 5A is a schematic top view illustrating a memory element of a memory cell of a non-volatile memory according to a second embodiment of the present invention;

FIG. 5B is schematic cross-sectional view of the memory element as shown in FIG. 5A and taken along the line A-B;

FIG. 5C schematically illustrates bias voltages for performing associated operations on the memory element of the memory cell according to the second embodiment of the present invention;

FIG. 5D schematically illustrates bias voltages for performing associated operations on a variant example of the memory element of the memory cell according to the second embodiment of the present invention;

DETAILED DESCRIPTION OF PREFERRED EMBODIMENTS

Figure 1:
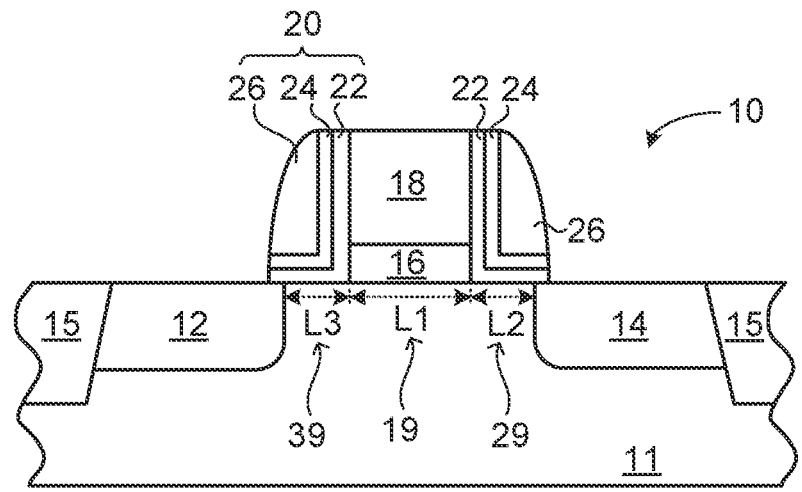
FIG. 1 (prior art) is a schematic cross-sectional view illustrating a memory element of a conventional non-volatile memory.
Figure 2:
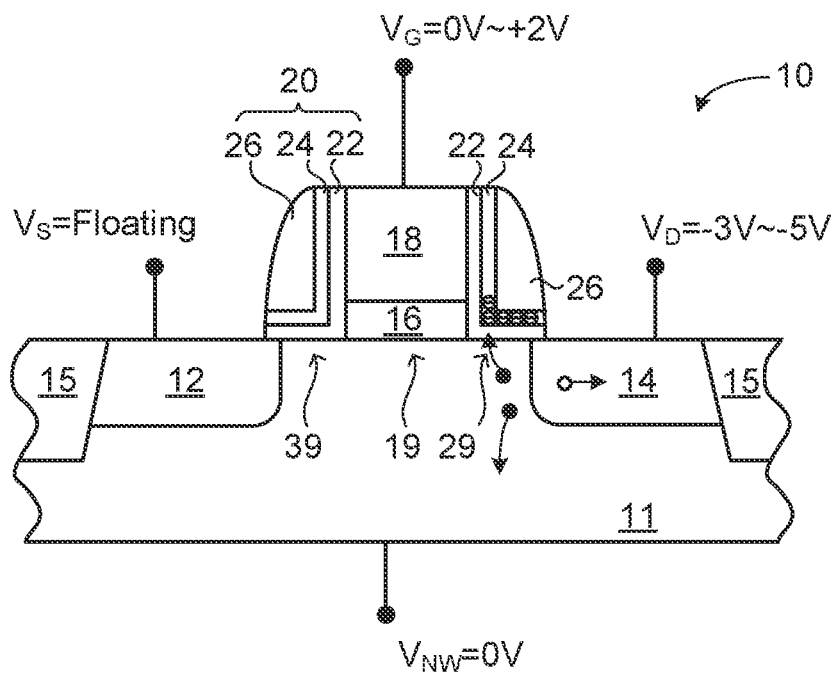
FIG. 2 (prior art) schematically illustrates associated bias voltages for performing a program operation on the conventional memory element.

FIGS. 3A to 3F are schematic views illustrating a manufacturing process of a memory cell of a non-volatile memory according to a first embodiment of the present invention. In these drawings, FIGS. 3A, 3C and 3E are schematic top views of the non-volatile memory, and FIGS. 3B, 3D and 3F are schematic cross-sectional views of the non-volatile memory and taken along the line A-B.

Please refer to FIG. 3A and FIG. 3B. Firstly, a C-shaped gate structure 380 is formed on a well region 310. The gate structure 380 comprises two protrusion parts 380*a* and 380*b*, which are in parallel with each other. The surface 380c of the protrusion part 380a and the surface 380d of the protrusion part 380b face each other. In other words, a notch 386 is defined by the two protrusion parts 380a and 380b collaboratively. The gate structure 380 comprises a gate dielectric layer 382 and a control gate layer 384. After the gate dielectric layer 382 is formed on the surface of the well region 310, the control gate layer 384 is formed over the gate dielectric layer 382 to cover the gate dielectric layer 382. The control gate layer 384 is a polysilicon control gate layer. The gate dielectric layer 382 is a silicon oxide layer.

Please refer to FIG. 3C and FIG. 3D. Then, a spacer 330 is formed around the sidewall of the gate structure 380. The spacer 330 is an oxide-nitride-oxide (ONO) spacer. The ONO spacer 330 comprises a silicon oxide layer 332, a silicon nitride layer 334 and a silicon oxide layer 336. The silicon oxide layer 332 is contacted with the sidewall of the gate structure 380. The silicon oxide layer 332 is also contacted with the surface of the well region 310. The silicon nitride layer 334 covers the silicon oxide layer 332. The silicon oxide layer 336 covers the silicon nitride layer 334. The silicon nitride layer 334 is used as a charge-trapping layer.

Due to the notch 386 of the C-shaped gate structure 380, the process of forming the spacer 330 has the following features. During the process of forming the spacer 330, the forming material of the spacer 330 is filled into the notch 386 and contacted with three surfaces (i.e. the surfaces 380c, 380d and a surface between the surfaces 380c, 380d) of the sidewall of the C-shaped gate structure 380 at the notch 386. After an etching process, more forming material of the spacer 330 is retained on the C-shaped gate structure 380 at the notch 386. Consequently, the spacer 330 formed on the two lateral sides of the C-shaped gate structure 380 is an asymmetric spacer. The spacer 330 includes a right part and a left part, and the right part of the spacer is arranged around the protrusion parts 380a and 380b to contact the surfaces 380c, 380d and a surface connected between the surfaces 380c, 380d at the notch 386. The widths of the right part and the left part of the spacer 330 are different. Moreover, the physical height of the right part is higher than the physical height of the left part. As shown in FIG. 3D, the right part of the spacer 330 is wider than the left part of the spacer 330.

Please refer to FIGS. 3E and 3F. Then, a source/drain doping process is performed. Consequently, a first doped region 320 and a second doped region 340 are formed in well region 310. The first doped region 320 and the second doped region 340 are located beside a first side and a second side of the gate structure 380 and a first side and a second side of the spacer 330, respectively. After a first metal electrode 322 and a second metal electrode 342 are respectively connected with the first doped region 320 and the second doped region 340, a memory element 300 is formed. In an embodiment, the first doped region 320 and the second doped region 340 are P-type doped regions, and the well region is an N-type well region. The memory cell of this embodiment comprises the memory element 300. The memory element 300 is a P-channel transistor. The first doped region 320 is a source region. The second doped region 340 is a drain region.

As shown in FIGS. 3E and 3F, a channel region is located under the surface of the well region 310 between the first doped region 320 and the second doped region 340. The two surfaces 380c and 380d of the gate structure 380 are in parallel with the length direction of the channel region. The channel region comprises a first channel 391, a second channel 392 and a third channel 393. The first channel 391, the second channel 392 and the third channel 393 have channel lengths L1, L2 and L3, respectively. The first channel 391 is located under the gate structure 380 and is arranged between the second channel 392 and the third channel 393. The second channel 392 is arranged between the second doped region 340 and the first channel 391. The third channel 393 is arranged between the first channel 391 and the first doped region 320. The wider part (i.e., the right part) of the spacer 330 is located over the second channel 392. The narrower part (i.e., the left part) of the spacer 330 is located over the third channel 393.

As mentioned above, the memory element 300 has the C-shaped gate structure 380. Since the three surfaces of the sidewall of the gate structure 380 are located beside the second channel 392, more forming material of the spacer 330 is retained, and the right part of the spacer 330 is wider. As shown in FIG. 3F, the silicon oxide layer 332 of the spacer 330 is contacted with the sidewall of the gate structure 380, and the silicon oxide layer 332 is contacted with the surface of the well region 310 and extended to the first doped region 320 and the second doped region 340, respectively. After the silicon oxide layer 332 is covered with the silicon nitride layer 334 and the etching process is performed, the asymmetric spacer 330 is formed. Since the widths of the right part and the left part of the spacer 330 around the gate structure 380 are different, the length of the second channel 392 and the length of the third channel 393 are different. Preferably, the length of the second channel 392 is larger than the length of the third channel 393, and the length of the second channel 392 is smaller than or equal to three times the length of the third channel 393. That is, the right part of the spacer 330 is wider than the left part of the spacer 330, and the width of the right part of the spacer 330 is smaller than three times the width of the left part of the spacer 330. Since the right part of the spacer 330 is wider, the silicon nitride layer 334 in the right part of the spacer 330 is longer to store more electrons.

As mentioned above, since the right part of the spacer 330 is relatively high in physical height, more dopant ions are blocked by the right part of the spacer 330 for preventing the second doped region 340 formed under the silicon oxide 332 during the source/drain doping process. Consequently, the second channel 392 of the memory element 300 is longer, and the ratio of the injection channel length to the total channel length, i.e., $$\frac{L2}{(L1+L2+L3)},$$

is increased. When the program operation of the memory element 300 is performed, more carriers are injected into the silicon nitride layer 334 of the spacer 330 through the second channel 392. Consequently, the program operation of the memory element 300 is performed more efficiently, and the time period of performing the program operation is reduced.

FIG. 3G schematically illustrates bias voltages for performing associated operations on the memory element of the memory cell according to the first embodiment of the present invention. The first doped region 320 receives a source line voltage $V_{SL}$. The second doped region 340 receives a bit line voltage $V_{BL}$. The control gate layer 384 receives a gate voltage $V_G$. The well region 310 receives a well voltage $V_{NW}$. Note that for simplification of the drawing, a contact contacted with the control gate layer 384 for receiving the gate voltage $V_G$ is omitted in the top view and cross-sectional view of the embodiments of the memory cell.

When the program operation (PGM) is performed on the memory element 300 according to a band-to-band hot electron injection (BBHE) effect, the source line voltage $V_{SL}$ is in a floating state, the gate voltage $V_G$ is higher than or equal to 0V, the bit line voltage $V_{BL}$ is −6V, and the well voltage $V_{NW}$ is 0V. Since the gate voltage $V_G$ is higher than the bit line voltage $V_{BL}$, the first channel 391 underlying the gate structure 380 will be turned off. Moreover, electron-hole pairs are generated at the junction between the well region 310 and the second doped region 340 and the band-to-band hot electron injection (BBHE) effect occurs. Consequently, electrons are injected into the silicon nitride layer 334 near the drain side through the second channel 392. That is, electrons are injected from the second channel 392 into the charge-trapping layer of the wider part of the spacer 330 near the second doped region 340.

When the program operation (PGM) is performed on the memory element 300 according to a channel hot electron injection (CHE) effect, the source line voltage $V_{SL}$ is 0V, the gate voltage $V_G$ is −1V, the bit line voltage $V_{BL}$ is −6V, and the well voltage $V_{NW}$ is 0V. Since the gate voltage $V_G$ is lower than the source line voltage $V_{SL}$, the first channel 391 underlying the gate structure 380 is turned on, and the channel region between the first doped region 320 and the second doped region 340 is turned on. Consequently, a program current is generated. When electrons flow through the second channel 392, the CHE effect occurs. Consequently, electrons are injected into the silicon nitride layer 334 near the drain side through the second channel 392. That is, electrons are injected from the second channel 392 into the charge-trapping layer of the wider part of the spacer 330 near the second doped region 340.

When an erase operation (ERS) is performed on the memory element 300 according to a channel hot hole injection (CHH) effect, the source line voltage $V_{SL}$ is 0V, the gate voltage $V_G$ is −6V, the bit line voltage $V_{BL}$ is −6V, and the well voltage $V_{NW}$ is 0V. Since the gate voltage $V_G$ is lower than the source line voltage $V_{SL}$, the first channel 391 underlying the gate structure 380 is turned on, and the channel region between the first doped region 320 and the second doped region 340 is turned on. When holes flow through the second channel 392, the CHH effect occurs. Consequently, holes are injected into the silicon nitride layer 334 near the drain side through the second channel 392, and the electrons in the silicon nitride layer 334 are erased by the injected holes.

When an erase operation (ERS) is performed on the memory element 300 according to a Fowler-Nordheim Tunneling (FN) effect, the source line voltage $V_{SL}$ is +6V, the gate voltage $V_G$ is −6V, the bit line voltage $V_{BL}$ is +6V, and the well voltage $V_{NW}$ is +6V. Since the gate voltage $V_G$ is lower than the well voltage $V_{NW}$, the FN effect occurs. Consequently, electrons in the silicon nitride layer 334 are ejected from the silicon nitride layer 334 to the well region 310.

When an erase operation (ERS) is performed on the memory element 300 according to a band-to-band hot hole injection (BBHH) effect, the source line voltage $V_{SL}$ is floating, the gate voltage $V_G$ is −6V, the bit line voltage $V_{BL}$ is −6V, and the well voltage $V_{NW}$ is 0V. Since the gate voltage $V_G$ is −6V and the bit line voltage $V_{BL}$ is −6V, the first channel 391 underlying the gate structure 380 will be turned off. Moreover, electron-hole pairs are generated at the junction between the well region 310 and the second doped region 340 and the band-to-band hot hole injection (BBHH) effect occurs. Consequently, holes are injected into the silicon nitride layer 334 near the drain side through the second channel 392, and the electrons in the silicon nitride layer 334 are erased by the injected holes.

When a read operation (READ) is performed on the memory element 300, the source line voltage $V_{SL}$ is −1V, the gate voltage $V_G$ is −1V, the bit line voltage $V_{BL}$ is 0V, and the well voltage $V_{NW}$ is 0V. Meanwhile, the channel region between the first doped region 320 and the second doped region 340 is turned on, and a read current is generated. In case that electrons are stored in the silicon nitride layer 334 of the memory element 300, the magnitude of the read current is higher. Under this circumstance, the memory element 300 is regarded to be in a first storage state. Whereas, in case that no electrons/holes are stored in the silicon nitride layer 334 of the memory element 300, the magnitude of the read current is lower. Under this circumstance, the memory element 300 is regarded to be in a second storage state. In other words, the storage state of the memory element 300 can be determined according to the magnitude of the read current.

The bias voltages provided to the memory element 300 of the memory cell are described herein for illustration only. It is noted that the bias voltages may be varied according to the practical requirements. By providing proper bias voltages to the memory element 300, the program operation, the erase operation or the read operation can be implemented.

In the above embodiment, the memory element of the memory cell is a P-channel transistor. Alternatively, the memory element of the memory cell is an N-channel transistor.

FIG. 4A is a schematic cross-sectional view illustrating a first variant example of the memory element of the memory cell according to the first embodiment of the present invention. FIG. 4B schematically illustrates bias voltages for performing associated operations on the memory element as shown in FIG. 4A. In this embodiment, the memory element 300a is an N-channel transistor. The structure of the memory element 300a is similar to the structure of the memory element 300.

As shown in FIG. 4A, the memory element 300a in the memory cell comprises a well region 310a, a gate dielectric layer 382, a control gate layer 384, a spacer 330, a first doped region 320a and a second doped region 340a. The spacer 330 comprises a silicon oxide layer 332, a silicon nitride layer 334 and a silicon oxide layer 336. The first doped region 320a and the second doped region 340a are N-type doped regions. The well region 310a is a P well region. Similarly, a channel region is located under the surface of the well region 310a between the first doped region 320a and the second doped region 340a. The channel region comprises a first channel 391, a second channel 392 and a third channel 393.

Similarly, the memory element 300a has the C-shaped gate structure 380. Since three surfaces of the sidewall of the gate structure 380 are located beside the second channel 392, the asymmetric spacer 330 is formed. Since the widths of the right part and the left part of the spacer 330 around the gate structure 380 are different, the length of the second channel 392 and the length of the third channel 393 are different. Preferably, the length of the second channel 392 is larger than the length of the third channel 393, and the length of the second channel 392 is smaller than or equal to three times the length of the third channel 393.

As shown in FIG. 4B, the first doped region 320a receives the source line voltage $V_{SL}$, the second doped region 340a receives the bit line voltage $V_{BL}$, the control gate layer 384 receives a gate voltage $V_G$, and the well region 310 receives a well voltage $V_{PW}$.

When the program operation (PGM) is performed on the memory element 300a according to a band-to-band hot hole injection (BBHH) effect, the source line voltage $V_{SL}$ is in a floating state, the gate voltage $V_G$ is lower than or equal to 0V, the bit line voltage $V_{BL}$ is +6V, and the well voltage VPW is 0V. Since the gate voltage $V_G$ is lower than the bit line voltage $V_{BL}$, the first channel 391 underlying the gate structure 380 will be turned off. Moreover, electron-hole pairs are generated at the junction between the well region 310a and the second doped region 340 and the band-to-band hot hole injection (BBHH) effect occurs. Consequently, holes are injected into the silicon nitride layer 334 near the drain side through the second channel 392. That is, holes are injected from the second channel 392 into the charge-trapping layer of the wider part of the spacer 330 near the second doped region 340.

When an erase operation (ERS) is performed on the memory element 300a according to a channel hot electron injection (CHE) effect, the source line voltage $V_{SL}$ is 0V, the gate voltage $V_G$ is +6V, the bit line voltage $V_{BL}$ is +6V, and the well voltage $V_{PW}$ is 0V. Since the gate voltage $V_G$ is higher than the source line voltage $V_{SL}$, the first channel 391 underlying the gate structure 380 is turned on, and the channel region between the first doped region 320a and the second doped region 340a is turned on. When electrons flow through the second channel 392, the CHE effect occurs. Consequently, electrons are injected into the silicon nitride layer 334 near the drain side through the second channel 392, and the holes in the silicon nitride layer 334 are erased by the injected electrons.

When a read operation (READ) is performed on the memory element 300a, the source line voltage $V_{SL}$ is +1V, the gate voltage $V_G$ is +1V, the bit line voltage $V_{BL}$ is 0V, and the well voltage $V_{PW}$ is 0V. Meanwhile, the channel region between the first doped region 320a and the second doped region 340a is turned on, and a read current is generated. In other words, the storage state of the memory element 300a can be determined according to the magnitude of the read current.

In the above embodiment, the memory element of the memory cell has the C-shaped gate structure. It is noted that the shape of the gate structure is not restricted as long as the asymmetric spacer can be formed on the gate structure.

FIG. 4C is a schematic cross-sectional view illustrating a second variant example of the memory element of the memory cell according to the first embodiment of the present invention. In comparison with the memory element 300 of FIG. 3F, the first doped region 320c of the memory element 300c of FIG. 4C further comprises an extension part 400, which is a LDD region. That is, a lightly doped drain (LDD) process is additionally performed on the narrower side of the spacer 330. After the extension part 400 is formed, the memory element 300c is not equipped with the third channel underlying the narrower side of the spacer 330. That is, the ratio of the injection channel length to the total channel length, i.e., $$\frac{L2}{(L1+L2)},$$

is increased. Consequently, the program operation of the memory element 300c is performed more efficiently. It is noted that the wider side of the spacer 330 does not need to undergo the lightly doped drain (LDD) process. Since the second channel 392 is not lost, electrons can still be injected into the silicon nitride layer 334 near the drain side.

FIG. 4D is a schematic top view illustrating a third variant example of the memory element of the memory cell according to the first embodiment of the present invention. In this embodiment, the memory element 300d has an L-shaped control gate layer 384d. That is, the memory element 300d has an L-shaped gate structure. The L-shaped gate structure has a protrusion part 410. The surface 411 of the protrusion part 410 is in parallel with the length direction of the channel region. A spacer 330d is arranged around the sidewall of the gate structure. After a source/drain doping process is performed, a first doped region 320d and a second doped region 340d are formed in well region 310d. The first doped region 320d and the second doped region 340d are located beside a first side and a second side of the spacer 330d, respectively. After a first metal electrode 322d and a second metal electrode 342d are respectively connected with the first doped region 320d and the second doped region 340d, the memory element 300d is formed.

During the process of forming the spacer 330d, the forming material of the spacer 330d is filled into the corner of the L-shaped gate structure and contacted with two surfaces of the sidewall of the L-shaped gate structure at the corner. After an etching process, more forming material of the spacer 330d is retained on the L-shaped gate structure at the corner. That is, the right part of the spacer 330d is arranged around the protrusion part 410 to contact the surface 411 and the surfaces connected in vertical with the surface 411. Consequently, the spacer 330d formed on the two lateral sides of the L-shaped gate structure is an asymmetric spacer. The widths of the right part and the left part of the spacer 330d are different.

The cross-sectional view of the memory element 300d taken along the line A-B is similar to that of FIG. 3F, and not redundantly described herein. Since the memory element 300d has the L-shaped gate structure, the two surfaces of the sidewall of the gate structure are located beside the second channel.

FIG. 4E is a schematic top view illustrating a fourth variant example of the memory element of the memory cell according to the first embodiment of the present invention. In comparison with the memory element 300 of FIG. 3E, the gate structure of the memory element 300e is extended to the adjacent memory elements 300g and 300h. That is, the control gate layer 384e is shared by the memory elements 300e, 300g and 300h. The structures of the memory elements 300e, 300g and 300h are identical.

Similarly, more forming material of the spacer 330e is retained on the control gate layer 384e at the notch. Consequently, the spacer 330e formed on the two lateral sides of the gate structure is an asymmetric spacer. The widths of the right part and the left part of the spacer 330e are different. After a source/drain doping process is performed, a first doped region 320e and a second doped region 340e are formed in well region 310e. The first doped region 320e and the second doped region 340e are located beside a first side and a second side of the spacer 330e, respectively. After a first metal electrode 322e and a second metal electrode 342e are respectively connected with the first doped region 320e and the second doped region 340e, the memory element 300e is formed.

The cross-sectional view of the memory element 300e taken along the line A-B is similar to that of FIG. 3F, and not redundantly described herein. Since the memory element 300e has the C-shaped gate structure, the three surfaces of the sidewall of the gate structure are located beside the second channel.

FIG. 4F is a schematic top view illustrating a fifth variant example of the memory element of the memory cell according to the first embodiment of the present invention. In comparison with the memory element 300 of FIG. 3E, the channel width of the memory element 300f of this embodiment is narrower. That is, according to the semiconductor process specification, a narrower channel is designed to reduce the size of the memory element 300f.

Similarly, more forming material of the spacer 330f is retained on the control gate layer 384f at the notch. Consequently, the spacer 330f formed on the two lateral sides of the gate structure is an asymmetric spacer. The widths of the right part and the left part of the spacer 330f are different. After a source/drain doping process is performed, a first doped region 320f and a second doped region 340f are formed in well region 310f. The first doped region 320f and the second doped region 340f are located beside a first side and a second side of the spacer 330f, respectively. After a first metal electrode 322f and a second metal electrode 342f are respectively connected with the first doped region 320f and the second doped region 340f, the memory element 300f is formed.

The cross-sectional view of the memory element 300f taken along the line A-B is similar to that of FIG. 3F, and not redundantly described herein. Since the memory element 300f has the C-shaped gate structure, the three surfaces of the sidewall of the gate structure are located beside the second channel.

From the above descriptions, the memory element has the asymmetrical spacer. The gate structure of the memory element has the special shape. The sidewall of the gate structure has plural surfaces. At least two surfaces of the sidewall of the gate structure are located beside the second channel. Consequently, the part of the spacer near the second channel is wider.

FIG. 5A is a schematic top view illustrating a memory element of a memory cell of a non-volatile memory according to a second embodiment of the present invention. FIG. 5B is schematic cross-sectional view of the memory element as shown in FIG. 5A and taken along the line A-B. The memory cell of this embodiment comprises a memory element 500. In comparison with the memory element 300 of the first embodiment, the memory element 500 of this embodiment further comprises an assisted electrode 502 for enhancing the program efficiency and the erase efficiency of the memory element 500. For succinctness, only the assisted electrode 502 will be described as follows.

The assisted electrode 502 is located over the part of the spacer 330 between the gate structure 380 and the second doped region 340. That is, the assisted electrode 502 is located over the wider part of the spacer 330. Moreover, a dielectric layer 504 is arranged between the assisted electrode 502 and the spacer 330. The dielectric layer 504 is used as a resistance protection oxide (RPO) layer. Note that for simplification of the drawing, the dielectric layer 504 is omitted in FIG. 5A.

FIG. 5C schematically illustrates bias voltages for performing associated operations on the memory element of the memory cell according to the second embodiment of the present invention. In comparison with FIG. 3G, the bias voltages of FIG. 5C further contains an assisted voltage $V_A$. The other bias voltages of FIG. 5C are similar to those of FIG. 3G, and not redundantly described herein.

As shown in FIG. 5C, the memory element 500 is a P-channel transistor, and the assisted electrode 502 receives the assisted voltage $V_A$. When a program operation is performed, electrons are controlled to be injected into the silicon nitride layer 334 according to the assisted voltage $V_A$. When an erase operation is performed, holes are controlled to be injected into the silicon nitride layer 334 or electrons are ejected from the silicon nitride layer 334 according to the assisted voltage $V_A$.

As mentioned above, the memory element 500 is a P-channel transistor. When the program operation (PGM) is performed on the memory element 500 according to the band-to-band hot electron injection (BBHE) effect, the assisted voltage $V_A$ is +3V. When the program operation (PGM) is performed on the memory element 500 according to the channel hot electron injection (CHE) effect, the assisted voltage $V_A$ is −3V. When an erase operation (ERS) is performed on the memory element 500 according to the channel hot hole injection (CHH) effect, the assisted voltage $V_A$ is −3V. When an erase operation (ERS) is performed on the memory element 500 according to the Fowler-Nordheim Tunneling (FN) effect, the assisted voltage $V_A$ is −6V. When an erase operation (ERS) is performed on the memory element 500 according to the band-to-band hot hole injection (BBHH) effect, the assisted voltage $V_A$ is −3V. When a read operation (READ) is performed on the memory element 500, the assisted voltage $V_A$ is −1V.

The bias voltages provided to the memory element 500 of the memory cell are described herein for illustration only. It is noted that the bias voltages may be varied according to the practical requirements. By providing proper bias voltages to the memory element 500, the program operation, the erase operation or the read operation can be implemented.

In the above embodiment, the memory element of the memory cell is a P-channel transistor. Alternatively, the memory element of the memory cell is an N-channel transistor. The structure of the N-channel transistor (i.e., a memory element) is similar to the structure of the memory element as shown in FIG. 5B.

FIG. 5D schematically illustrates bias voltages for performing associated operations on a variant example of the memory element of the memory cell according to the second embodiment of the present invention. As shown in FIG. 5D, the memory element 500 is an N-channel transistor, and the assisted electrode 502 receives the assisted voltage $V_A$. When the program operation (PGM) is performed on the memory element 500 according to the band-to-band hot hole injection (BBHH) effect, the assisted voltage $V_A$ is lower than or equal to 0V. When an erase operation (ERS) is performed on the memory element 500 according to the channel hot electron injection (CHE) effect, the assisted voltage $V_A$ is +6V. When a read operation (READ) is performed on the memory element 500, the assisted voltage $V_A$ is +1V.

Figure 5E:
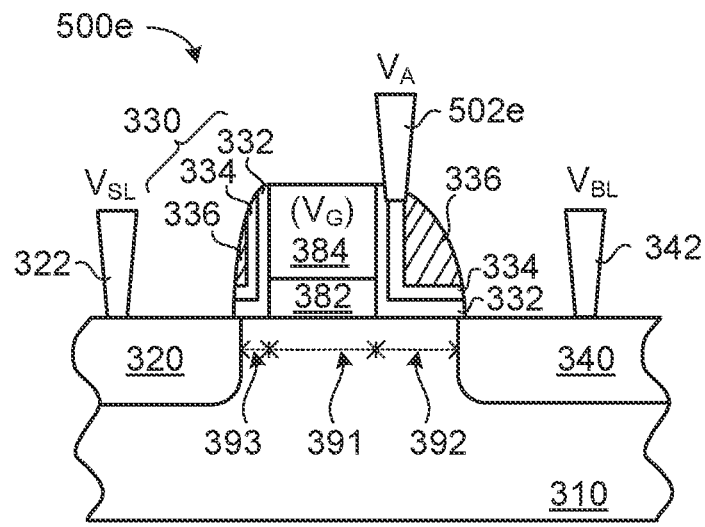
FIG. 5E is a schematic top view illustrating a first variant example of the memory element of the memory cell according to the second embodiment of the present invention.

FIG. 5E is a schematic top view illustrating a first variant example of the memory element of the memory cell according to the second embodiment of the present invention. In comparison with the memory element 500 of FIG. 5B, the assisted electrode 502e of the memory element 500e of this embodiment is directly contacted with the spacer 330. For example, the assisted electrode 502e may directly contacted with the silicon oxide layer 332, the silicon nitride layer 334, and the silicon oxide layer 336. The spacer 330 is made of a nonconductive material. Consequently, when the assisted electrode 502e is contacted with the spacer 330, the memory element 500e can be normally subjected to the program operation, the erase operation and the read operation. The bias voltages for performing the associated operations are similar to those of FIGS. 5C and 5D, and not redundantly described herein.

The memory element of this embodiment can be further modified. For example, in some embodiments, the gate structure is modified to the L-shaped gate structure as shown in FIG. 4C. In some other embodiments, like the memory element as shown in FIG. 4D, the gate structure is extended to the adjacent memory element. In some other embodiment, like the memory element as shown in FIG. 4E, the channel width of the memory element is modified. Moreover, the assisted electrode 502 as shown in FIG. 5B and the assisted electrode 502*e* as shown in FIG. 5E can be contacted with the control gate layer 384.

Figure 6A:
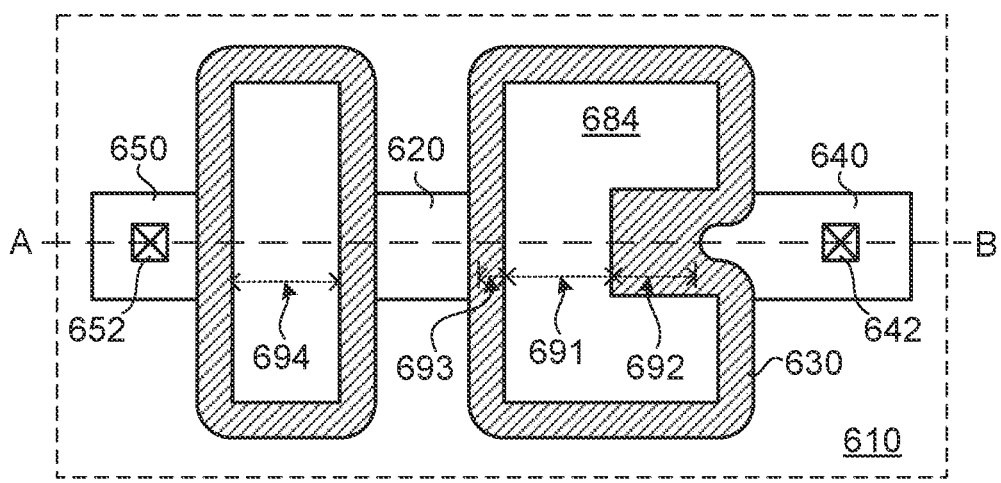
FIG. 6A is a schematic top view illustrating a memory cell of a non-volatile memory according to a third embodiment of the present invention.
Figure 6B:
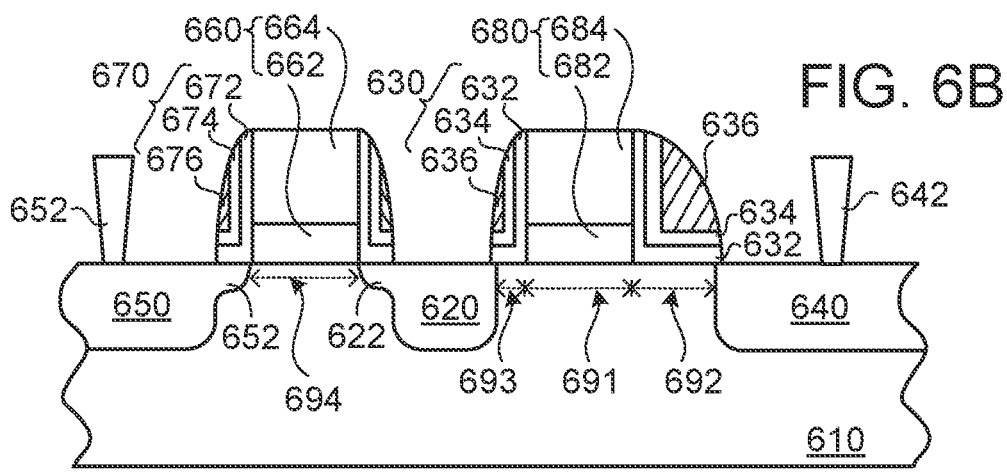
FIG. 6B is schematic cross-sectional view of the memory element as shown in FIG. 6A and taken along the line A-B.

FIG. 6A is a schematic top view illustrating a memory cell of a non-volatile memory according to a third embodiment of the present invention. FIG. 6B is schematic cross-sectional view of the memory element as shown in FIG. 6A and taken along the line A-B. In comparison with the memory cell of the first embodiment comprising a single memory element 300, the memory cell of this embodiment comprises a memory element and a select transistor. The manufacturing process of the memory cell of the first embodiment is similar to that of the first embodiment, and not redundantly described herein.

The memory element comprises a well region 610, a first doped region 620, a second doped region 640, a gate structure 680 and a spacer 630. The gate structure 680 comprises a gate dielectric layer 682 and a control gate layer 684. The spacer 630 is an oxide-nitride-oxide (ONO) spacer. The ONO spacer 630 comprises a silicon oxide layer 632, a silicon nitride layer 634 and a silicon oxide layer 636.

The first doped region 620 and the second doped region 640 are formed under the surface of the well region 610. A metal electrode 642 is connected with the second doped region 640. The gate structure 680 and the spacer 630 are formed over the surface of the well region 610 between the first doped region 620 and the second doped region 640. The C-shaped gate structure 680 is contacted with the top surface of the well region 610. The spacer 630 is arranged around the sidewall of the gate structure 680. The silicon oxide layer 632 of the spacer 630 is contacted with the sidewall of the gate structure 680, and the silicon oxide layer 632 is contacted with the surface of the well region 610 and extended to the first doped region 620 and the second doped region 640. The silicon nitride layer 634 covers the silicon oxide layer 632. The silicon oxide layer 636 covers the silicon nitride layer 634. The silicon nitride layer 634 is used as a charge-trapping layer.

A channel region is located under the surface of the well region 610 between the first doped region 620 and the second doped region 640. The channel region comprises a first channel 691, a second channel 692 and a third channel 693. The first channel 691 is located under the gate structure 680. The second channel 692 is arranged between the second doped region 640 and the first channel 691. The third channel 693 is arranged between the first channel 691 and the first doped region 620. The wider part (i.e., the right part) of the spacer 630 is located over the second channel 692. The narrower part (i.e., the left part) of the spacer 630 is located over the third channel 693.

As mentioned above, the memory element has the C-shaped gate structure. Since the three surfaces of the sidewall of the gate structure are located beside the second channel 692, the widths of the right part and the left part of the spacer 630 around the gate structure are different. In addition, the length of the second channel 692 is larger than the length of the third channel 693, and the length of the second channel 692 is smaller than or equal to three times the length of the third channel 693.

The select transistor comprises a well region 610, the first doped region 620, a third doped region 650, a gate structure 660 and a spacer 670. The gate structure 660 comprises a gate dielectric layer 662 and a select gate layer 664. The spacer 670 is an oxide-nitride-oxide (ONO) spacer. The ONO spacer 670 comprises a silicon oxide layer 672, a silicon nitride layer 674 and a silicon oxide layer 676.

During the process of manufacturing the select transistor, a lightly doped drain (LDD) process is additionally performed. Consequently, the first doped region 620 comprises an extension part 622 which is a LDD region, and the third doped region 650 comprises an extension part 652 which is a LDD region. The extension parts 622 and 652 are located under the spacer 670.

In the select transistor, the first doped region 620 and the third doped region 650 are formed under the surface of the well region 610. A metal electrode 652 is contacted with the third doped region 650. The gate structure 660 is formed over the surface of the well region 610 between the first doped region 620 and the third doped region 650. The gate structure 660 is contacted with the top surface of the well region 610. The spacer 670 is arranged around the sidewall of the gate structure 660 and contacted with the surface of the well region 610. Moreover, the region under the surface of the well region 610 between the first doped region 620 and the third doped region 650 is a fourth channel 694.

By providing proper bias voltages to the select transistor, the select transistor is turned on. After the select transistor is turned on, the memory element can be subjected to the program operation, the erase operation or the read operation. Since no channels are formed under the spacer 670 of the select transistor, no carriers are injected into the spacer 670 of the select transistor while the program operation is performed.

In an embodiment, the memory element and the select transistor of the memory cell are both P-channel transistors. Alternatively, the memory element and the select transistor of the memory cell are both N-channel transistors.

The memory element of this embodiment can be further modified. For example, in some embodiments, the gate structure is modified to the L-shaped gate structure as shown in FIG. 4C. In some other embodiments, like the memory element as shown in FIG. 4D, the gate structure is extended to the adjacent memory element. In some other embodiment, like the memory element as shown in FIG. 4E, the channel width of the memory element is modified.

Figure 7A:
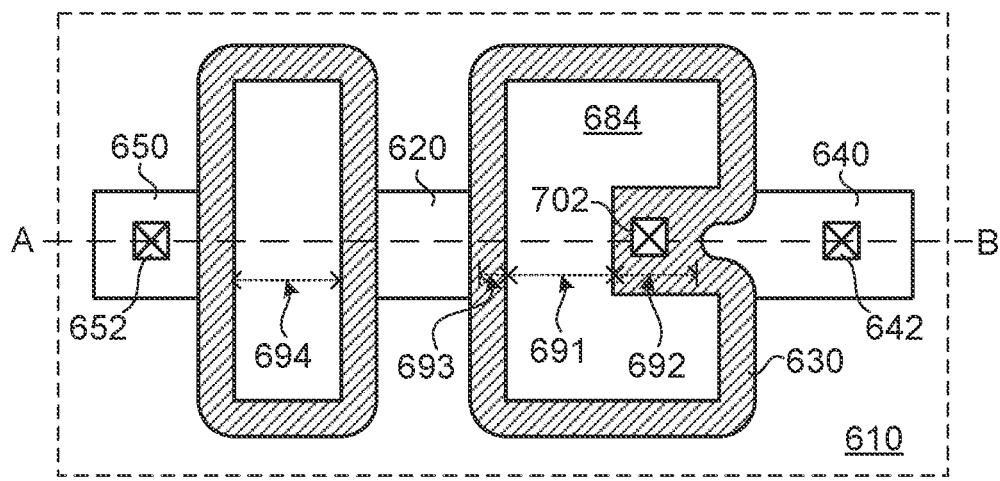
FIG. 7A is a schematic top view illustrating a memory element of a memory cell of a non-volatile memory according to a fourth embodiment of the present invention.
Figure 7B:
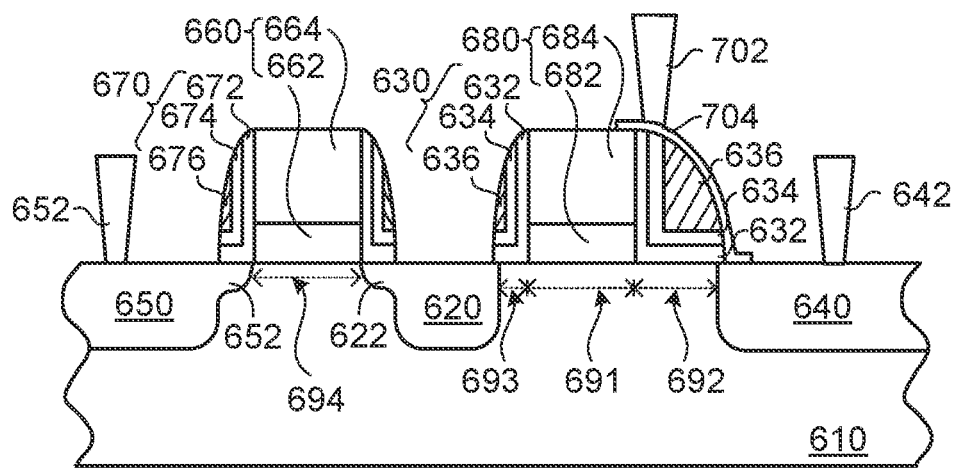
FIG. 7B is schematic cross-sectional view of the memory element as shown in FIG. 7A and taken along the line A-B.

FIG. 7A is a schematic top view illustrating a memory element of a memory cell of a non-volatile memory according to a fourth embodiment of the present invention. FIG. 7B is schematic cross-sectional view of the memory element as shown in FIG. 7A and taken along the line A-B. The memory cell of this embodiment comprises a select transistor and a memory element. In comparison with the memory element of the third embodiment, the memory element of this embodiment further comprises an assisted electrode 702 for enhancing the program efficiency and the erase efficiency of the memory element. For succinctness, only the assisted electrode 702 will be described as follows. Note that for simplification of the drawing, the dielectric layer 704 is omitted in FIG. 7A.

The assisted electrode 702 is located over the part of the spacer 630 between the gate structure 680 and the second doped region 640. That is, the assisted electrode 702 is located over the wider part of the spacer 630. Moreover, a dielectric layer 704 is arranged between the assisted electrode 702 and the spacer 630. The dielectric layer 704 is used as a resistance protection oxide (RPO) layer.

By providing proper bias voltages to the select transistor, the select transistor is turned on. After the select transistor is turned on, the memory element can be subjected to the program operation, the erase operation or the read operation. Since no channels are formed under the spacer 670 of the select transistor, no carriers are injected into the spacer 670 of the select transistor while the program operation is performed.

In an embodiment, the memory element and the select transistor of the memory cell are both P-channel transistors. Alternatively, the memory element and the select transistor of the memory cell are both N-channel transistors.

The memory element of this embodiment can be further modified. For example, in some embodiments, the gate structure is modified to the L-shaped gate structure as shown in FIG. 4C. In some other embodiments, like the memory element as shown in FIG. 4D, the gate structure is extended to the adjacent memory element. In some other embodiment, like the memory element as shown in FIG. 4E, the channel width of the memory element is modified. In some embodiments, the assisted electrode 702 is contacted with the control gate layer 384. Alternatively, the assisted electrode 702 is contacted with the spacer 630.

From the above descriptions, the present invention provides a memory cell of a non-volatile memory. The memory element of the memory cell is a transistor with an asymmetric spacer. In the memory element, the channel under the wider part of the spacer is longer. When the program operation of the memory element is performed, more carriers are injected into the charge-trapping layer of the spacer through the longer channel. Consequently, the program operation of the memory element is performed more efficiently, and the time period of performing the program operation is reduced.

Moreover, the gate structure of the memory element has the special shape. The sidewall of the gate structure has plural surfaces. At least two surfaces of the sidewall of the gate structure are located beside the second channel. Consequently, the part of the spacer near the second channel is wider.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell of a non-volatile memory, the memory cell comprising a memory element, the memory element comprising:
    a well region;
    a gate structure formed on a surface of the well region, wherein the gate structure comprises at least one protrusion part;
    a spacer arranged around a sidewall of the gate structure and contacted with the surface of the well region, wherein the spacer comprises a first part and a second part; and
    a first doped region and a second doped region formed under the surface of the well region, wherein a region between the first doped region and the second doped region is a channel region, and the channel region comprises a first channel and a second channel,
    wherein the first part of the spacer is arranged around the at least one protrusion part, and a width of the first part of the spacer is wider than a width of the second part of the spacer, and the width of the first part of the spacer is smaller than or equal to three times the width of the second part of the spacer,
    wherein both of the first part of the spacer and the second part of the spacer comprise a first silicon oxide layer, a silicon nitride layer and a second silicon oxide layer, wherein the first silicon oxide layer is contacted with the surface of the well region and the sidewall of the gate structure, the silicon nitride layer covers the first silicon oxide layer, and the second silicon oxide layer covers the silicon nitride layer, wherein the silicon nitride layer is a charge-trapping layer,
    wherein the sidewall of the gate structure comprises plural surfaces, and a first surface of the at least one protrusion part is in parallel with a length direction of the channel region,
    wherein the first channel is located under the gate structure, the second channel is arranged between the first channel and the second doped region, and the first part of the spacer is located over the second channel,
    wherein when a program operation is performed, the gate structure receives a gate voltage and plural carriers are injected into the charge-trapping layer in the first part of the spacer through the second channel.

2. The memory cell as claimed in claim 1, wherein the channel region further comprises a third channel located between the first channel and the first doped region, and the second part of the spacer is located over the third channel, and a length of the second channel is larger than a length of the third channel.

3. The memory cell as claimed in claim 1, wherein two of the plural surfaces of the sidewall of the gate structure are located beside the second channel.

4. The memory cell as claimed in claim 1, wherein the memory element further comprises an assisted electrode and a dielectric layer, wherein the assisted electrode is located over the first part of the spacer, and the dielectric layer is arranged between the assisted electrode and the first part of the spacer.

5. The memory cell as claimed in claim 4, wherein the assisted electrode is contacted with a control gate layer of the gate structure.

6. The memory cell as claimed in claim 1, wherein the memory element further comprises an assisted electrode, and the assisted electrode is contacted with the first part of the spacer.

7. The memory cell as claimed in claim 6, wherein the assisted electrode is contacted with a control gate layer of the gate structure.

8. The memory cell as claimed in claim 1, wherein the gate structure comprises two protrusion parts, which are a first protrusion part and a second protrusion part, and a surface of the first protrusion part and a surface of the second protrusion part are face each other to define a notch of the gate structure, and the first part of the spacer contacted with the surface of the first protrusion part and the surface of the second protrusion part at the notch.

9. A memory cell of a non-volatile memory, the memory cell comprising:
    a memory element comprising a well region, a first gate structure, a first spacer, a first doped region and a second doped region; wherein the first gate structure is formed on a surface of the well region and the gate structure comprises at least one protrusion part, the first spacer is arranged around a sidewall of the first gate structure and contacted with the surface of the well region, the first spacer comprises a first part and a second part; wherein the first doped region and the second doped region are formed under the surface of the well region, a region between the first doped region and the second doped region is a channel region, and the channel region comprises a first channel and a second channel; wherein the sidewall of the gate structure comprises plural surfaces, and a first surface of the at least one protrusion part is in parallel with a length direction of the channel region; wherein the first channel is located under the first gate structure, the second channel is arranged between the first channel and the second doped region, and the first part of the first spacer is located over the second channel; and a select transistor comprising the well region, a second gate structure, a second spacer and a third doped region, wherein the second gate structure is formed on the surface of the well region, the second spacer is arranged around a sidewall of the second gate structure and contacted with the surface of the well region, and the third doped region is formed under the surface of the well region, wherein a region between the first doped region and third doped region is a fourth channel, and the fourth channel is located under the second gate structure, wherein the first part of the first spacer is arranged around the at least one protrusion part, and a width of the first part of the first spacer is wider than a width of the second part of the first spacer, and the width of the first part of the first spacer is smaller than or equal to three times the width of the second part of the first spacer, wherein both of the first part of the first spacer and the second part of the first spacer comprise a first silicon oxide layer, a silicon nitride layer and a second silicon oxide layer, wherein the first silicon oxide layer is contacted with the surface of the well region and the sidewall of the first gate structure, the silicon nitride layer covers the first silicon oxide layer, and the second silicon oxide layer covers the silicon nitride layer, wherein the silicon nitride layer is a charge-trapping layer, wherein when a program operation is performed, the gate structure receives a gate voltage and plural carriers are injected into the charge-trapping layer in the first part of the first spacer through the second channel of the memory element.

10. The memory cell as claimed in claim 9, wherein the channel region further comprises a third channel located between the first channel and the first doped region, and the second part of the spacer is located over the third channel, and a length of the second channel is larger than a length of the third channel.

11. The memory cell as claimed in claim 9, wherein two of the plural surfaces of the sidewall of the first gate structure are located beside the second channel.

12. The memory cell as claimed in claim 9, wherein the memory element further comprises an assisted electrode and a dielectric layer, wherein the assisted electrode is located over the first part of the first spacer, and the dielectric layer is arranged between the assisted electrode and the first part of the first spacer.

13. The memory cell as claimed in claim 12, wherein the assisted electrode is contacted with a control gate layer of the first gate structure.

14. The memory cell as claimed in claim 9, wherein the memory element further comprises an assisted electrode, and the assisted electrode is contacted with the first part of the first spacer.

15. The memory cell as claimed in claim 14, wherein the assisted electrode is contacted with a control gate layer of the first gate structure.

16. The memory cell as claimed in claim 9, wherein the first gate structure comprises two protrusion parts, which are a first protrusion part and a second protrusion part, and a surface of the first protrusion part and a surface of the second protrusion part are face each other to define a notch of the first gate structure, and the first part of the first spacer contacted with the surface of the first protrusion part and the surface of the second protrusion part at the notch.

* * * * *